(12) United States Patent
Abgaryan et al.

(10) Patent No.: US 8,530,851 B2
(45) Date of Patent: Sep. 10, 2013

(54) ELECTRON BEAM PROFILE MEASUREMENT SYSTEM AND METHOD WITH OPTIONAL FARADAY CUP

(71) Applicant: ATTI International Services Company, Inc., Hauppauge, NY (US)

(72) Inventors: Artush A. Abgaryan, Huntington, NY (US); Eli Levi, Dix Hills, NY (US); Thomas Leddy, Eastport, NY (US)

(73) Assignee: ATTI International Services Company, Inc., Hauppauge, NY (US)

( * ) Notice: Subject to any disclaimer, the term of this patent is extended or adjusted under 35 U.S.C. 154(b) by 0 days.

(21) Appl. No.: 13/723,269

(22) Filed: Dec. 21, 2012

(65) Prior Publication Data

US 2013/0134323 A1 May 30, 2013

Related U.S. Application Data

(63) Continuation-in-part of application No. PCT/US2012/024312, filed on Feb. 8, 2012.

(60) Provisional application No. 61/440,443, filed on Feb. 8, 2011.

(51) Int. Cl.
*H01J 3/14* (2006.01)

(52) U.S. Cl.
CPC .................................. *H01J 3/14* (2013.01)
USPC ........................................................ 250/397

(58) Field of Classification Search
USPC .......................................................... 250/397
See application file for complete search history.

(56) References Cited

U.S. PATENT DOCUMENTS

| | | | |
|---|---|---|---|
| 3,268,812 A * | 8/1966 | Meyer et al. | 324/71.1 |
| 3,638,111 A | 1/1972 | Ennis, Jr. et al. | |
| 3,736,422 A | 5/1973 | Weber et al. | |
| 3,784,909 A | 1/1974 | Schutt et al. | |
| 4,086,491 A | 4/1978 | Vaughan | |
| 4,602,272 A | 7/1986 | Duschl | |
| 6,577,365 B1 * | 6/2003 | Chaudhari et al. | 349/124 |
| 6,657,212 B2 | 12/2003 | Komori et al. | |
| 7,817,288 B2 | 10/2010 | Ishida et al. | |
| 8,084,929 B2 | 12/2011 | Abgaryan et al. | |
| 8,084,930 B2 | 12/2011 | Abgaryan et al. | |

FOREIGN PATENT DOCUMENTS

| | | |
|---|---|---|
| JP | 11251100 A | 9/1999 |
| JP | 2007257986 A | 10/2007 |
| TW | 398154 B | 7/2000 |
| WO | 2012109340 A1 | 8/2012 |

OTHER PUBLICATIONS

Abstract of TW 398154 B.
Abstract of JP 11251100 A.

* cited by examiner

*Primary Examiner* — Kiet T Nguyen
(74) *Attorney, Agent, or Firm* — Brian Roffe

(57) ABSTRACT

Electron beam profile testing and analysis method is introduced using the MOMS apparatus. The MOMS apparatus includes a Faraday Cup with a knife-wires scanning system which together perform simultaneous measurements. The scanning system has a five-dimensional processing mechanism for measuring different cross sections of an e-beam profile in a path of the e-beam. Measurements are conducted using the scanning system by virtually dividing each cross section into a plurality of subsections and measuring independent current values of at least one wire of the scanning system through which the electron beam passes from every pixel in each of the plurality of subsections. By providing relative movement between the scanning system and e-beam, the measured independent current values are analyzed to obtain the functional form of distribution of current density of the cross-section of the e-beam. The Faraday cup enables simultaneous measurement of the total value of the current.

20 Claims, 3 Drawing Sheets

ELECTRON BEAM PROFILE MEASUREMENT SYSTEM AND METHOD WITH OPTIONAL FARADAY CUP

CROSS REFERENCE TO RELATED APPLICATIONS

This application is a continuation-in-part of International Application No. PCT/US2012/024312 filed Feb. 8, 2012 which claims priority of U.S. provisional patent application Ser. No. 61/440,443 filed Feb. 8, 2011, both of which are incorporated by reference herein.

FIELD OF THE INVENTION

The present invention relates generally to micro-optical measuring systems (MOMS) and methods, and micro-mechanical measuring systems and methods, Faraday cup processes, and more particularly to a measuring system that is capable of measuring, for example, a profile of an electron beam or other similar beams for which measurements and software automated profile analysis are sought, and also provides opportunities for high accuracy focal spot size diameter measurement and methods for performing measurements using laser beam parameters of the system.

BACKGROUND OF THE INVENTION

The following U.S. patents may be relevant to the invention: U.S. Pat. Nos. 3,638,111, 3,736,422, 3,784,909, 4,086,491 and 6,657,212, all of which are incorporated by reference herein. Additional details about a micro-optical measuring system and method capable of measuring a profile of an electron beam or other similar beams for which measurements are sought, and method for performing measurements using the system, are disclosed in U.S. provisional patent application Ser. No. 61/440,443 filed Feb. 8, 2011 and International Application No. PCT/US2012/024312, filed Feb. 8, 2012.

SUMMARY OF THE INVENTION

Any electron or laser beam interacting with a medium generally results in the change of electrical, optical and/or mechanical characteristics of the medium. For example, these interactions cause changes in the coefficient of thermal conductivity of the medium and the coefficient of thermal capacitance of the medium. These changes to the medium in turn provide new opportunities for the solution of a crucial metrological problem: the capability for high accuracy measurement of current density distribution ranging from about 0.1 $nA/mm^2$ to about 10 $A/mm^2$ intensity in e-beam (electron beam) cross sections, and also provide opportunities for high accuracy focal spot size diameter measurement.

In accordance with the invention, a knife-wires scanning system has a five dimensional processing mechanism for measuring different cross sections of an e-beam profile, wherein each cross section is virtually divided into a plurality of subsections in which, from every pixel, independent current values are measured. As a result, a sum of each individual current value provides the current density distribution for any cross sections of the e-beam. However, for complete monitoring of the e-beam profile, it has been found that it is optimal to use a one knife-wire system for measuring the diameter of the cross section with an electronic control programmer.

Further, in a preferred embodiment of the system, a valve plate made from tungsten, or more generally any high conductivity material, is added to the back of the wire holding section to create a functional Faraday cup process. The total measurement current can then be analyzed for calculating e-beam current density distribution, in a customary manner as when a Faraday cup is used.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
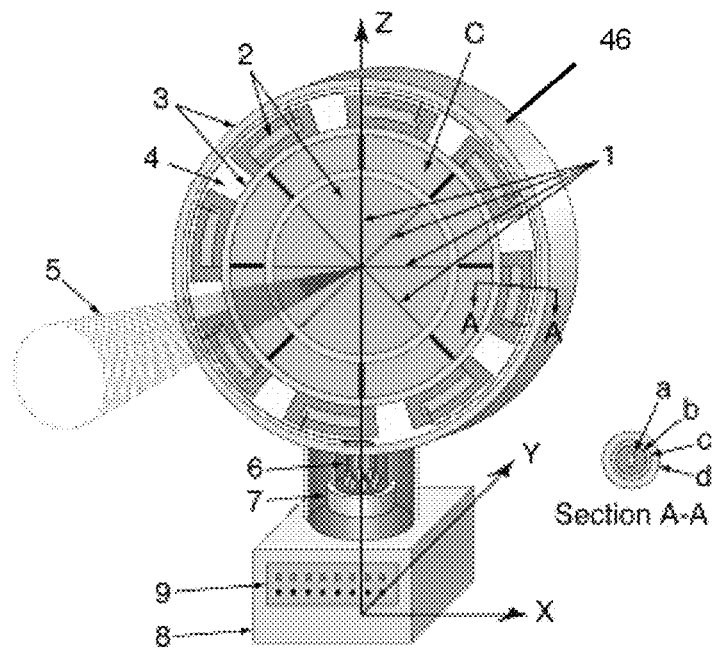
FIG. 1 illustrates an embodiment of a Faraday cup with a knife-wires scanning MOMS (micro-optical measuring system) for use, for example, for high accuracy measurement of e-beam diameter and current density distribution in different cross sections in accordance with the invention, and includes a cross-section of the system along the line A-A.

Conventional current density distribution measurement techniques for super small e-beam diameters, about 0.00007 m to about 0.005 m and more, do not currently have the capability for high accuracy measurements. In general, most if not all systems are based on the idea of converting one type of energy into another. In some instances, an e-beam is converted to light using scintillators for capturing images with CCD technology. This indirect method does not have the capability for high order measurement accuracy and unfortunately, provides only approximately 30% correct information due to such factors as e-beam scattering, optical interference between pixels, and limitations attributed to the CCD sensors tolerance. This method is characterized as a two-step measurement process: the conversion process followed by a secondary measuring method. Consequently, the overall measurement process can be considered a tertiary measurement method.

In accordance with the invention, a measurement method is based on a direct measurement of current density distribution of an e-beam ranging from about 0.1 $nA/mm^2$ to more than about 10 $A/mm^2$. In general, the measuring system includes a four-dimensional wire scanning process in the cross section of the e-beam. Virtually, a plurality of subsections is created wherein the size of each virtual subsection depends on, or is a function of, one or more of several different parameters including but not limited to the thickness of the material of the scanning wire and a moving speed of one or more of the mechanical stages that make up a platform that is capable of moving in three orthogonal directions. From the defined moving speed of the stage mechanism together with the moving time from the electronic control programmer, it is possible to accurately measure the cross section diameter of an e-beam, or other beam, by measuring electric current from edge to edge of the beam in a moving, one wire situation. This method directly measures current, and then calculates current density distribution from each subsection, thus leading to an indirect determination of current density distribution. The sum of each subsection is calculated, resulting in data for each cross section area. Then, the current measured by the wire is subtracted from the total current value, which is measured by a valve plate.

The measuring technology is preferably based on the creation of an electric circuit in a wire frame which has been calibrated beforehand, i.e., pre-calibrated, for high accuracy current, or no current, which is consequently compared with resulting current formed after the interaction of the e-beam with the wire medium. The total current value is simultaneously measured from the Faraday cup electric circuit. The Faraday cup is attached to the wire frame in a position to receive the electrons after interacting with the wire frame. Also, the current measuring system does not require any electrical support circuitry and is directly connected to a precision current measuring instrument to perform the measurements.

In some embodiments, the wire may be heated using an appropriate heating mechanism to decrease the temperature gradient between the wire medium and the e-beam electrons. This heating process, along with selection of material of the wire to be the same as the cathode material could enable a higher order measurement of current value. Therefore, the accuracy for current density distribution measurement depends on how many virtual pixels are created, which is dependent on wire thickness. In this measuring system, a wire cooling capability system is preferably included, using water or other cooling media.

Referring now to FIG. 1 which shows a non-limiting, exemplifying arrangement that may be used to perform the measuring method described above, the arrangement includes a linear stage 8 onto or in which electronic feedback controllers and/or connectors 6 are provided to control the mechanical and electrical components of the arrangement. Linear stage 8 may comprise a housing which has a substantially rectangular form as shown in FIG. 1, although other forms are envisioned within the scope of the invention. Linear stage 8 should be made of a material and have a construction sufficient to support the electronic feedback controller(s) and/or connector(s) 6 in the interior of the housing, and the structure exterior of and above the linear stage 1, which structure is described below.

A rotating mechanism is included in another linear stage 7, if necessary, and is arranged in connection with or mounted to the linear stage 8 and rotates relative to the linear stage 8. As shown, linear stage 8 is situated under linear stage 7 and supports it. However, linear stage 8 may be situated above linear stage 7 and, in both cases, one supports the other depending on their relative position. The rotating mechanism in linear stage 7 may be a turntable or other similar rotating structure known to those skilled in the art and some of which are commercially available.

A programmable moving mechanism in linear stage 8 is designed to provide accuracy to high orders of magnitude. The linear stages 7 and 8 change the e-beam profile position by means of one or more electronic motion controllers for adjusting measurement position (not shown). Linear stage 7 may comprise a housing which has a substantially cylindrical form as shown in FIG. 1, although other forms are envisioned within the scope of the invention. Linear stage 8 should be made of a material and have a construction sufficient to support the linear stage 7 and connectors 9, or vice versa depending on the relative position of linear stages 8 and 7.

Figure 2:
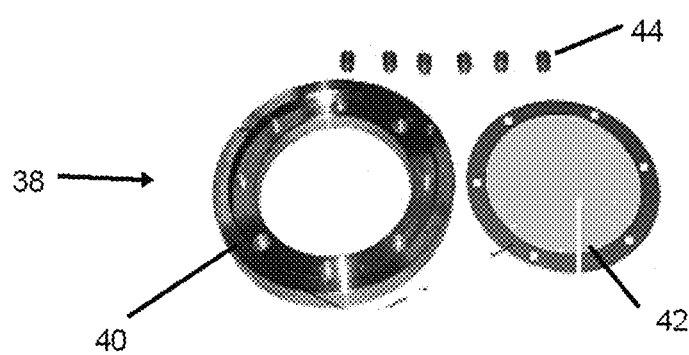
FIG. 2 illustrates a valve plate made with tungsten material, which is added to the back of the wire holding section to create a functional Faraday cup process.

FIG. 2 is a valve plate assembly 38, which is comprised two parts; a housing 40 that constitutes a back side of the wire holding section 46, and a flat part 42 in the form of a disc or valve plate that is preferably made of tungsten material which connects to an electrical circuit. The valve plate housing 40 is attached, e.g., by screws 44, to a back side of the wire holding section 46 (see FIG. 1). The disc or valve plate 42 is attached, e.g., by screws 44, to an inside of the valve plate housing 40. Screws 44 represent any attachment structure that connects the valve plate housing 40 to the wire holding section 46, and any attachment structure that connects the disc or valve plate 42 to the valve plate housing 40.

Valve plate assembly 38 serves as a Faraday cup to catch charged particles, i.e., the electron beams passing through the wire frame, with a measurement of the number of the charged particles, ions or electrons, being captured being converted into current. Instead of valve plate assembly 38, another comparable Faraday cup system may be attached to the wire holding section 46 in a path of the electron beam so that after interacting with the wire 1, the electron beam interacts with the Faraday cup with the number of charged particles, ions or electrons, that impact the Faraday cup being converted into a current measurement that is used to adjust the measured independent current values at the different points of the wire 1. This adjustment may be subtraction as described elsewhere herein, or another mathematical application or function as may be derived by one skilled in the art in vie of the disclosure herein.

At least one electronic connector/controller, part of element 7, is designed to couple the linear stages 7, 8 with existing connectors 9 on linear stage 8 and is designed to automate all mechanical and electronic systems. The coupling may be via wires or cables that extend through the linear stages 7, 8 to the connectors 9. Electronic feedback controller 6 is also used for maintaining the value of speed in all mechanisms, and thus effecting control over the speed of movement of the stages 7, 8. Instead of linear stages 7, 8, any other platform that is capable of moving in three orthogonal direction may be used, or otherwise simply providing such movement capability to an object mounted thereon. Further, instead of linear stages 7 and 8, any other structure that serves to enable three degrees of movement, i.e., in three orthogonal directions, and rotation may be used in the invention, whether considered as a single component or multiple components or stages.

Linear stage 8 may constitute a standard stage that is arranged on the rotating mechanism in linear stage 8, which may be implemented as a holder with an exit connector. A frame 3 is arranged on the linear stage 8. Frame 3 has a generally annular shape, e.g., a circular frame, and the arrangement is positioned such that an electron beam 5 from an electron beam generating system (not shown) passes through an interior region of the opening defined by the frame 3.

An electrical circuit is associated with the frame 3, and parts of the electric circuit are represented at 1, 2, and 6. Element C is a knife-wires system, element 1 is an electric wire and element 2 is a wetted contact, that has thermal cooling opportunities using liquid, gas or other state of material known to people skilled in the art which is shown in section "A-A".

In section "A-A", "a" is the wetted contact, "b" is electrically insulating material, "c" is a cooling medium and "d" is part of frame 3. A suitable cooling medium management or distribution system (not shown) is coupled to the area between the electrically insulating material b and the part d of the frame 3 to control the presence and/or flow of the cooling medium therebetween. The cooling medium management or distribution system is compatible with the cooling medium selected for use, e.g., a liquid, gas or other material. For example, such a system could include a conduit leading to the area between the electrically insulating material b and the part d of the frame 3, another conduit area leading from area between the electrically insulating material b and the part d of the frame 3 and a pump/control unit that causes flow of the cooling medium through the conduits. Variations would be readily apparent to one skilled in the art.

It is understood that the electric circuit, may be entirely internal to the frame 3, entirely external to the frame 3 or partly internal and partly external to the frame 3. The knife-wires system may be an existing system such as disclosed in U.S. Pat. No. 4,086,491, incorporated by reference herein.

The thickness of the wire 1 may be from about 1 um to about 14 um, and it is preferably made of a single metallic thread or conductivity polymer thread and is arranged on the frame 3, e.g., attached at each end to opposing portions of the frame 3. For example, the wires 2 may be made of tungsten. However, the choice of which wire to use and the materials of the wire, depends on the cathode material used in the e-beam generating device (which is not shown).

Figure 4:
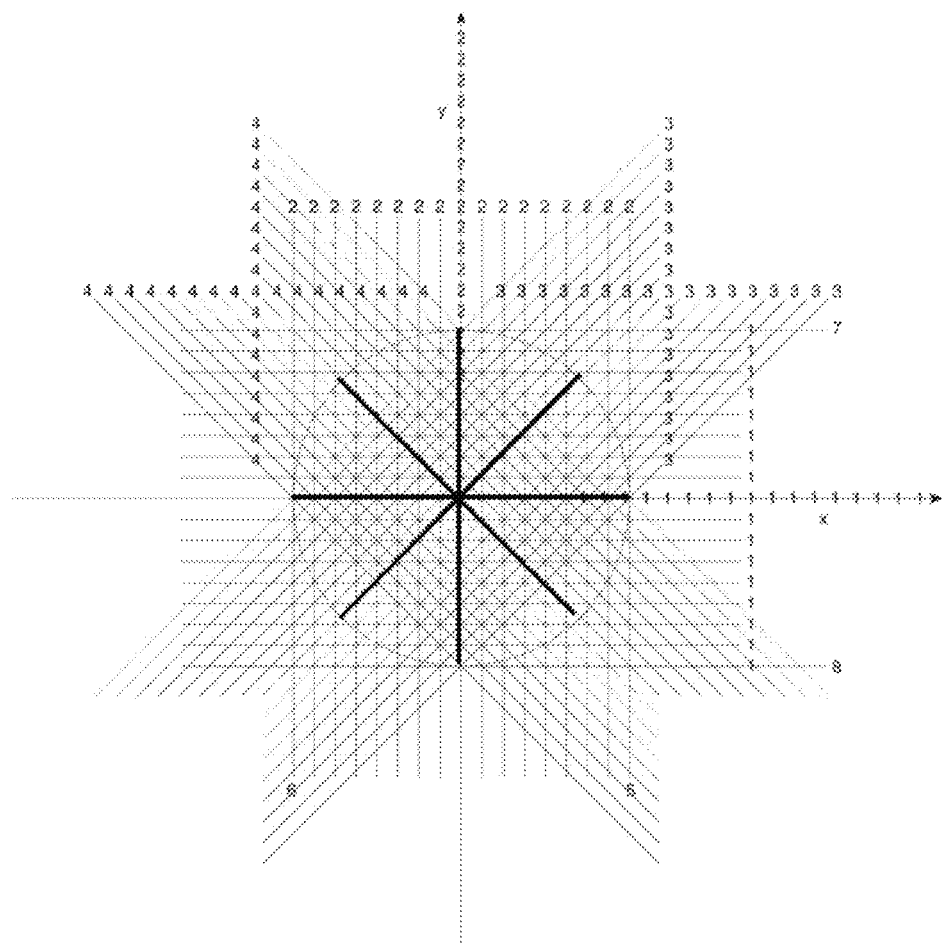
FIG. 4 shows an electron beam profile measurement process, which is scanned using tungsten, or other knife-wires, resulting in a moving vertical, horizontal and linear coordinate system, also using rotational coordinates, as shown in FIG. 1.

FIG. 4 shows a four wire system inside the frame, where the number of wires can be reduced or increased, with all of the wires intersecting at an approximate middle area of the interior of the frame 3. Since the number of wires connected to the frame 3 may vary, there may be an embodiment wherein there is only a single wire inside the frame, extending between opposed portions of the frame, or a plurality of such wires. When a plurality of wires is provided, they may be equally spaced around the frame and intersect at the middle of the opening defined by the frame 3. Non-equally spaced wires and/or wires that intersect at a region other than at the middle of the opening defined by the frame 3 may also be used in the invention without deviating form the scope and spirit thereof.

More specifically, FIG. 4 shows an electron beam profile, which is scanned using tungsten, or other conductive wires in a moving assembly through the vertical and horizontal linear coordinate system. There is a single wire arranged inside the rotational part of the frame 3. In an alternative construction, there may be a plurality of wires in a stationary part of the frame 3, e.g., the frame 3 shown in FIG. 1. The idea is to take current density measurements about each point on the virtual grid shown in FIG. 4. The virtual grid is divided into a number of ticks on the x-axis, e.g., m ticks, and a number of ticks on the y-axis, e.g., n ticks with m equal to or different than m, due to movement controlled by a software program for frame 3. This software program may be embodied on non-transitory computer-readable media resident in one or both of the linear stages 7, 8 and executed using a processor and other hardware components in the linear stages 7 and/or 8.

In one measurement example, the first point measured is at point (0,0), the center of the opening defined by the frame 3, and the measurements are taken at each point on the grid in an outward clockwise spiral fashion. The current density is measured at each point by:

1. Measuring current at point (m, n) in each of the four wires of the measuring target device;
2. Measuring current at each point surrounding the point (m, n);
3. From these points, forming triangles about point (m, n), and calculating the RMS values of these current measurements. In this step, the Faraday cup is connected for measurement of total current. The Faraday cup is electrical connected to the measuring device through a connector.
4. Calculating the RMS value from the RMS value of each triangle and then dividing it by the sum of the areas of the triangles.

Then, the measurement process moves to the next point in the grid to take the next set of measurements until the current density is calculated for each point in the grid. The current density is then available to be shown numerically in a table and graphically using color to show the current density distribution.

The arrangement also includes a processor, computer or other type of analysis unit 11 that is coupled to the electric circuit 1, 2, 4 and 6. This coupling may be a wired or wireless coupling, and may be achieved via the connectors 9 on the linear stage 8. Electric circuit 1, 2, 6 preferably has calibration opportunities implemented by software and/or hardware components, if it is necessary, i.e., electrical components to enable calibration of the measuring system, and is electrically connected to a number of the connectors 9 and the analysis unit 11. Electric circuit 1, 2, 6 thus serves to provide a wire 1 that is partly exposed in the opening of the frame 3 and affected by the passage of an electron beam, i.e., causing a change in current through the wire 1, with the current being measured by the electric circuit or a processing unit associated therewith. Analysis unit 11 preferably uses special software for analysis of a two to five-dimensional database in real time.

The arrangement in its entirely, other than the analysis unit 11, may be arranged in a vacuum space of an electron ray tube, where the e-beam ray 5 is shown.

Frame 3 is provided with mechanical capabilities for moving in a minimum of three dimensions in a Cartesian coordinate system using necessary stages 7, 8, (vertical-y, horizontal-x, linear-z, and possibly rotational-φ). These capabilities may be provided by motors, slides and other movement mechanisms known to those skilled in the art. An electronic motion controller with connectors 9 and analysis unit 11 can automatically regulate all mechanical movement mechanisms or other systems.

In use, the arrangement is placed such that an electron beam 5 from an electron beam generating system (not shown) passes through the opening in the frame 3, after one or more wires 1 is positioned therein, with the properties of the wires 1 preferably being selected in consideration of the generation of the electron beam. The frame 3 is then moved, under control of the electronic connectors 9, via the linear stage 8, the standard, linear stage 7, and the optional rotating mechanism if necessary.

The circuit 1, 2, 6 generates signals as a function of the passage of the electron beam through the wire or wires 1 that are connected in the circuit, where the circuit is coupled to the analysis unit 11 to enable a display of the profile information of the electron beam to be displayed. Thus, the electron beam passing through a wire causes a change in the current of the circuit 1, 2, 6, which current is measurable and convertible via a processor unit into an indication of the current density of the e-beam causing the current variation. For example, FIG. 1 shows an electron beam profile, which is scanned using tungsten, or other, wires in vertical, horizontal and linear (maybe rotational also) coordinates system using the system shown in FIG. 1.

As mentioned above, a cooling system may be incorporated into the invention to cool or otherwise regulate the temperature of the wires 1. To this end, each wire 1 may have a contact portion arranged in the frame 3 and the frame 3 includes an electrically insulating material around the contact portion and having a portion around and spaced apart from the electrically insulating material to thereby define a space therebetween (see section A-A in FIG. 1). A cooling medium is present in this space to cool the contact portion of the wire and thus the wire, e.g., conducted or passed therethrough.

Figure 3:
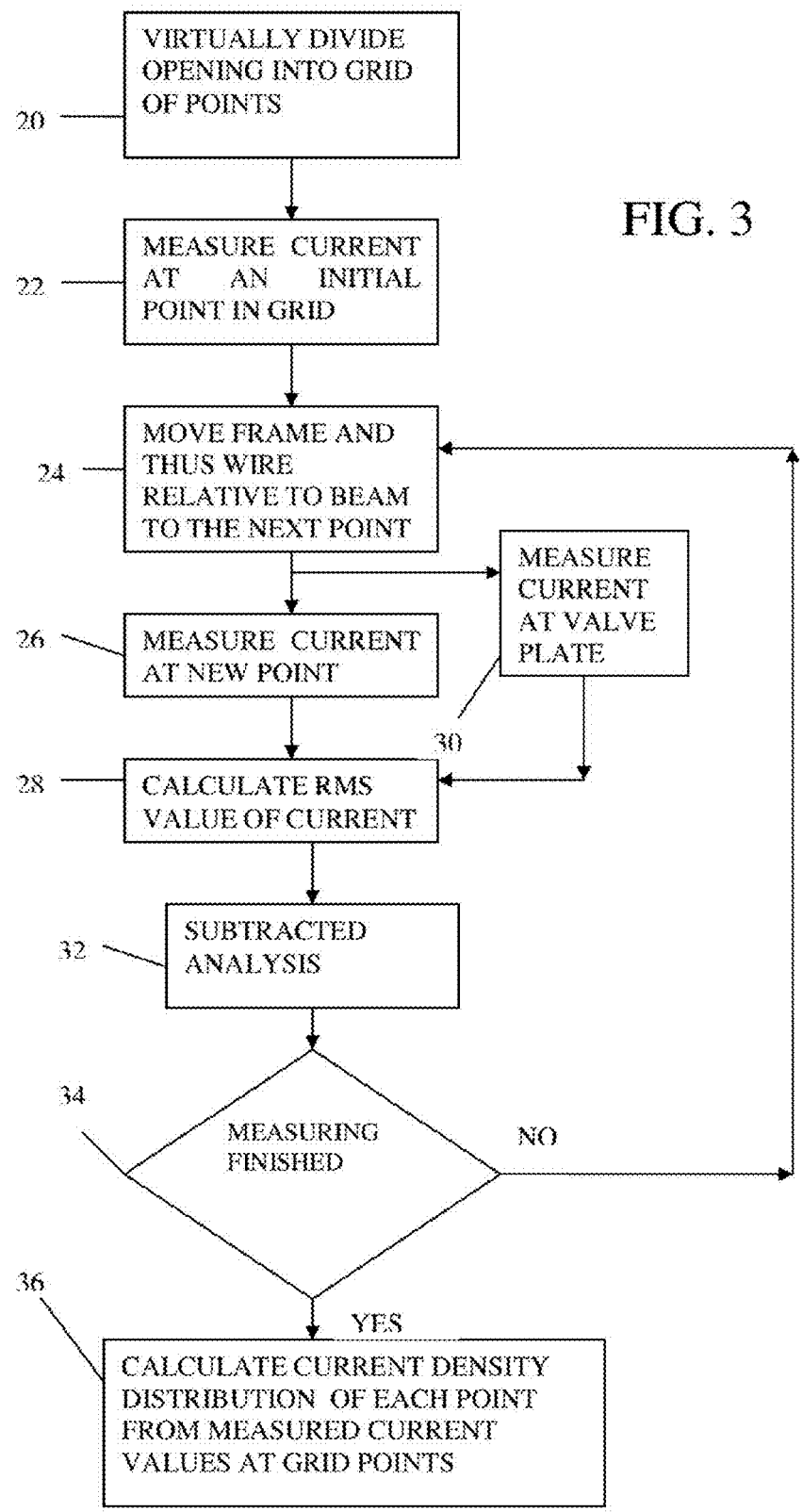
FIG. 3 is a flow chart outlining a method for current measurement of an electron beam in accordance with the invention.

Referring now to FIG. 3, a flow chart of an electron beam profile measurement method in accordance with the invention is illustrated, which flow chart may be the subject of a computer program that may be designed by a computer programmer. The first step, after configuring the scanning system relative to the electron beam being measured, is to virtually divide the opening of the frame of the scanning system, and through which the wire or wires extends, into a grid of points, step 20. This grid of point may be as shown in FIG. 4 or with fewer or more points. The spacing of the marks on the axes may also vary and the same spacing or different spacing may be present on the axes.

In step 22, the current of a selected, initial point in the grid is measured and preferably stored in a memory storage unit associated with the current measurement apparatus for later use and processing. Then, at step 24, the frame 3 is moved relative to the beam to the next point in the grid causing movement of the wire or wires relative to the beam. This movement is accomplished by the linear stages 7, 8 and rotating mechanism therein. A program of movement may be provided, i.e., via a computer program embodied on non-transitory computer-readable media, and controlled by a control unit or processor housed in the linear stage 8 and/or the linear stage 7 that executes the computer program, or movement commands may be provided to the linear stages 7, 8 via connectors 9.

After this movement is completed, in step 26, the current of a new point on the grid is again measured and stored in a memory storage unit associated with the current measurement apparatus for later use and processing. Parallel to this measuring process is step 30, where the current is measured at the valve plate. The RMS current value calculated in step 28, derived from the measured current at the valve plate and the new point, is subtracted from the valve plate measurement in step 32. The result is measuring data used to calculate the functional form of the current density distribution.

A determination is made at 34 as to whether the current measurement is finished. If not, the frame movement and subsequent grid point measurement steps are repeated. If the measurements are finished, in step 36, the measured current values of each of the points in the grid are processed to obtain a distribution of current density of the cross-section of the beam. The algorithm to process the current values may be as described above wherein triangles of points surrounding each point are formed and current values of these triangles considered, or may be another algorithm.

Once again, using this algorithm, the step of measuring the current values of each point in the grid comprises measuring current at a first point in each of the wires, measuring current at each point surrounding the first point and from the surrounding points, forming triangles and calculating RMS values of current measurements from the surrounding points in each triangle and then calculating as the current value of the first point, the RMS value of each triangle formed from surrounding points divided by a sum of areas of the triangles.

Additional details about the environment in which such a measurement system may be used are found in International Application No. PCT/US2012/024312, incorporated by reference herein.

Furthermore, details about the environment in which such a measurement system may be used are found in the following U.S. patent applications, all of which are incorporated by reference herein:
1. U.S. provisional patent application Ser. No. 61/173,796 filed Apr. 29, 2009, now expired;
2. U.S. provisional patent application Ser. No. 61/241,108 filed Sep. 10, 2009, now expired;
3. U.S. patent application Ser. No. 12/769,393 filed Apr. 28, 2010, now U.S. Pat. No. 8,084,929; and
4. U.S. patent application Ser. No. 12/957,576 filed Dec. 1, 2010, now U.S. Pat. No. 8,084,930.

As used herein, "RMS" is the square root of the arithmetic mean of the squares of the numbers in a given set of numbers.

Several computer programs resident on transitory or non-transitory computer-readable media may be used in the invention and their function and non-limiting location are mentioned above. In the context of this document, computer-readable media or medium could be any non-transitory means that can contain, store, communicate, propagate or transmit a program for use by or in connection with the method, system, apparatus or device. The computer-readable medium can be, but is not limited to (not an exhaustive list), electronic, magnetic, optical, electromagnetic, infrared, or semi-conductor propagation medium. The medium can also be (not an exhaustive list) an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM). The medium can also be paper or other suitable medium upon which a program is printed, as the program can be electronically captured, via for example, optical scanning of the paper or other medium, then compiled, interpreted, or otherwise processed in a suitable manner, if necessary, and then stored in a computer memory. Also, a computer program or data may be transferred to another computer-readable medium by any suitable process such as by scanning the computer-readable medium.

While particular embodiments of the invention have been shown and described, it will be obvious to those skilled in the art that changes and modifications may be made without departing from the invention in its broader aspects, and, therefore, the aim in claims to be presented in the application or set forth below is to cover all such changes and modifications as fall within the true spirit and scope of the invention. Indeed, it is envisioned that any feature shown in or described in connection with one embodiment may be applied to any of the other embodiments shown or described herein to the extent not inconsistent with a particular feature of that embodiment.

We claim:

1. An electron beam profile measurement method, comprising:
arranging a scanning system in a path of the beam, the scanning system including at least one wire extending across an opening of a frame and being movable to cause movement of the at least one wire relative to the path of the beam;
virtually dividing the opening into a grid of points;
conducting current measurements by:
measuring independent current values of an initial point in the grid while the at least one wire is in one position relative to the beam; then
moving the at least one wire relative to the beam and measuring independent current values of a new point in the grid while the at least one wire is in the moved position relative to the beam; then
repeating the moving and measuring step; and
processing, using a processor, the measured independent current values of a plurality of the points of the grid obtained while the at least one wire was in a plurality of different positions relative to the beam to obtain a distribution of current density of the cross-section of the beam.

2. The method of claim 1, wherein the step of virtually dividing the opening into a grid of points comprises dividing each of a pair of orthogonal axes into a plurality of points.

3. The method of claim 1, wherein the step of conducting current measurements further comprises conducting the measurements of the points in the grid starting from a center point of the opening and proceeding from the center point in an outward spiral manner.

4. The method of claim 1, wherein the at least one wire comprises a plurality of wires and the step of measuring the current values of each point in the grid comprises:
measuring current at a first point in each of the wires;
measuring current at each point surrounding the first point and from the surrounding points, forming triangles and calculating RMS values of current measurements from the surrounding points in each triangle; and then
calculating as the current value of the first point, the RMS value of each triangle formed from surrounding points divided by a sum of areas of the triangles; and
then changing the first point to another point and repeating the current measuring and current value calculating steps.

5. The method of claim 1, wherein the step of processing the measured independent current values comprises summing the individual current values.

6. The method of claim 1, further comprising selecting a size of the grid of points as a function of a thickness of material of the least one wire.

7. The method of claim 1, further comprising mounting the scanning system on at least one movable stage to enable movement of the at least one wire relative to the beam.

8. The method of claim 7, further comprising selecting a size of the grid of points as a function of a speed of movement of at least one of the stages.

9. The method of claim 7, wherein the scanning system is mounted on a plurality of stages to provide for movement of the at least one wire in three orthogonal directions.

10. The method of claim 1, further comprising conducting the measurement of the current values based on pre-calibration of an electric circuit including the at least one wire.

11. The method of claim 1, further comprising heating at least one wire of the scanning system prior to current measurement.

12. The method of claim 1, further comprising selecting properties of the at least one wire relative to properties of the beam being analyzed.

13. The method of claim 1, further comprising:
arranging a valve plate behind the at least one wire in the path of the beam;
connecting the valve plate in an electric circuit; and
measuring current of the electric circuit including the valve plate when measuring the independent current values of the points in the grid;
wherein the step of processing the measured independent current values of the plurality of the points in the grid to obtain the functional form of distribution of current density of the cross-section of the beam comprises adjusting each measured independent current values by the measured current of the electric circuit including the valve plate.

14. An electron beam profile measurement system, comprising:
a movable platform;
an annular frame coupled to said platform and movable thereby, said frame being positioned such that the beam passes through an interior region defined by an opening of said frame;
electric circuitry including at least one wire extending through said opening of said frame and that forms a circuit including said at least one wire such that the circuit generates signals as a function of passage of the beam through or around said at least one wire; and
an analysis unit coupled to said electric circuitry and arranged to process the signals in consideration of the position of said at least one wire relative to the beam into information about the profile of the beam.

15. The system of claim 14, wherein said platform comprises a first stage arranged to move or provide movement in a first linear direction and a second stage arranged to move or provide movement in a second linear direction orthogonal to the first direction, one of said first and second linear stages including a rotation mechanism that rotates said frame.

16. The system of claim 14, wherein a thickness of said at least one wire is from about 1 um to about 25 um and is made of tungsten.

17. The system of claim 14, wherein each of said at least one wire is attached at each end to opposing portions of said frame.

18. The system of claim 14, wherein said at least one wire comprises a plurality of wires spaced around said frame and intersecting at a middle of said opening defined by said frame.

19. The system of claim 14, wherein said at least one wire includes a contact portion arranged in said frame and said frame includes an electrically insulating material around said contact portion and having a portion around and spaced apart from said electrically insulating material to thereby define a space therebetween, a cooling medium being present in said space to cool said contact portion of said at least one wire and thus said at least one wire.

20. The system of claim 14, further comprising:
a valve plate situated behind said at least one wire in the path of the beam, said valve plate being connected in an electric circuit,
said analysis unit being coupled to said electric circuit including said valve plate and arranged to process the signals in further consideration of measured current of the electric circuit including said valve plate into information about the profile of the beam.

* * * * *